(12) United States Patent
Shiomi et al.

(10) Patent No.: US 9,614,525 B2
(45) Date of Patent: Apr. 4, 2017

(54) PARALLEL INTERFACE AND INTEGRATED CIRCUIT

(71) Applicant: Rohm Co., Ltd., Kyoto (JP)

(72) Inventors: Kazuma Shiomi, Kyoto (JP); Takateru Yamamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/805,538

(22) Filed: Jul. 22, 2015

(65) Prior Publication Data

US 2016/0028408 A1    Jan. 28, 2016

(30) Foreign Application Priority Data

Jul. 25, 2014 (JP) ................................ 2014-151848

(51) Int. Cl.
*H03L 7/00* (2006.01)
*H03K 19/0175* (2006.01)

(52) U.S. Cl.
CPC .......................... *H03K 19/017509* (2013.01)

(58) Field of Classification Search
CPC ....................................................... H03L 7/00
USPC ....................................................... 327/141
See application file for complete search history.

(56) References Cited

U.S. PATENT DOCUMENTS 5,268,932 A * 12/1993 Okuzono .............. H04J 3/0629
                                                         375/354
2011/0181370 A1* 7/2011 Guilar ............... H04L 12/40032
                                                           333/1

FOREIGN PATENT DOCUMENTS

JP            07-240600         9/1995

* cited by examiner

*Primary Examiner* — Lincoln Donovan
*Assistant Examiner* — Metasebia Retebo
(74) *Attorney, Agent, or Firm* — Fish & Richardson P.C.

(57) ABSTRACT

A parallel interface is disclosed. The parallel interface of the present disclosure includes an input unit configured to input, in parallel, a plurality of predetermined data signals and a clock signal; an output unit configured to output, in parallel, the predetermined data signals in synchronization with the clock signal; and a plurality of transmission lines disposed between the input unit and the output unit and configured to transmit, in parallel, the predetermined data signals and the clock signal, wherein the transmission lines are configured with a wiring pattern in which the transmission lines have different electrical lengths and an equal electrical capacitance.

11 Claims, 11 Drawing Sheets

Example of waveform in which all data bits are in phase (Input pattern A)

Example of waveform in which D0 is in antiphase (Input pattern B)

Example of waveform in which D22 is in antiphase (Input pattern B)

PARALLEL INTERFACE AND INTEGRATED CIRCUIT

CROSS-REFERENCE TO RELATED APPLICATION

This application is based upon and claims the benefit of priority from Japanese Patent Application No. 2014-151848, filed on Jul. 25, 2014, the entire contents of which are incorporated herein by reference.

TECHNICAL FIELD

The present disclosure relates to a parallel interface and an integrated circuit.

BACKGROUND

As one of data transmission schemes used in the related art for data transmission between a data input side and a variety of semiconductor devices, there exists a parallel interface that transmits data signals in parallel, i.e., transmits a plurality of bits simultaneously.

For example, in an IC for image processing or an IC for an LCD driver, image data signals and a parallel clock signal (hereinafter, referred to as a clock signal) are inputted from transmission lines on the side of twenty-five input/output (IO) units and then latched in a logic circuit (e.g., a logic unit configured with a level shifter) in the IC.

In order to improve synchronization accuracy of such data signals, etc., it is necessary to match the delays of the data signals and the clock signal from the IO unit to the logic unit.

There have been proposed techniques for matching such delays by making the lengths of wirings that form the transmission lines from the IO unit to the logic unit all equal so that the electrical resistances of the wirings are all equal.

In order to suppress the data signals inputted from the IO unit from chattering, a Schmitt buffer may be disposed, which is one type of hysteresis buffers.

Since the output impedance of the Schmitt buffer is typically high, it tends to depend more on wiring capacitance than on wiring resistance. Accordingly, there has been a problem of relatively long transmission lines in that differences in wiring capacitance are generated between the transmission lines.

Due to such differences in wiring capacitance, it is difficult to match the delay times of data signals and a clock signal in transmission lines, which results in lowering the accuracy of AC timing such as set up time and hold time.

SUMMARY

The present disclosure provides some embodiments of a parallel interface in which the delay amounts of data signals and a clock signal are equal even in the case of relatively long wirings, and an integrated circuit using such a parallel interface.

According to one embodiment of the present disclosure, there is provided a parallel interface including an input unit configured to input, in parallel, a plurality of predetermined data signals and a clock signal; an output unit configured to output, in parallel, the predetermined data signals in synchronization with the clock signal; and a plurality of transmission lines disposed between the input unit and the output unit and configured to transmit, in parallel, the predetermined data signals and the clock signal, wherein the transmission lines are configured with a wiring pattern in which the transmission lines have different electrical lengths and an equal electrical capacitance.

According to another embodiment of the present disclosure, an integrated circuit including the parallel interface is provided.

DETAILED DESCRIPTION

Figure 1:
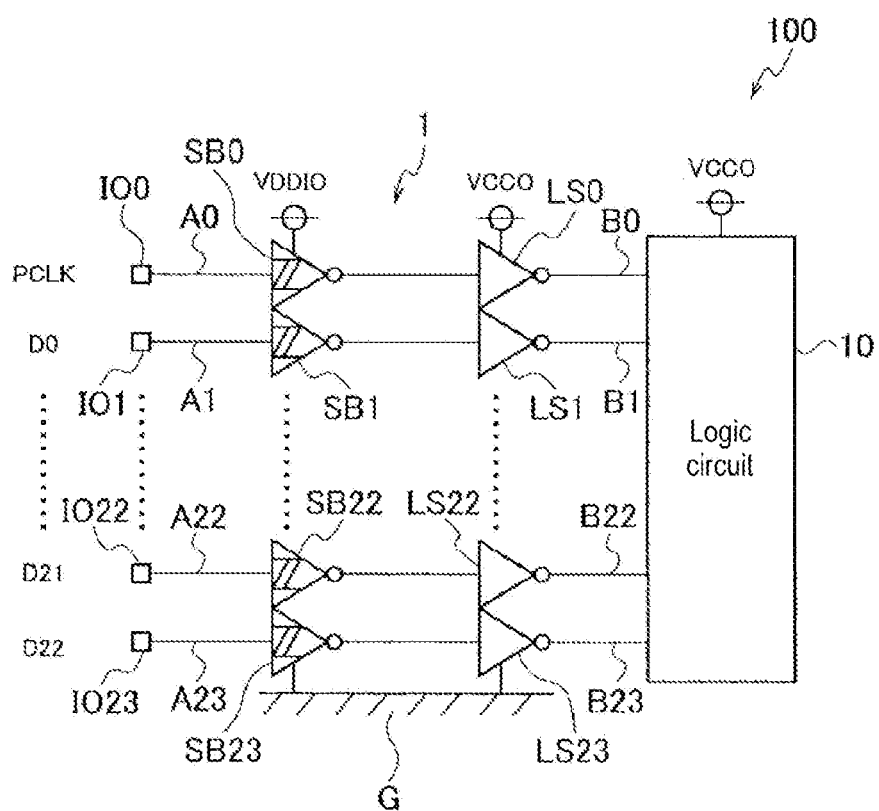
FIG. 1 is a diagram showing a schematic configuration of an integrated circuit employing a parallel interface, according to an embodiment of the present disclosure.

Embodiments of the present disclosure will be described with reference to the accompanying drawings. In the drawings, the same or similar reference numerals refer to the same or similar elements. It should be noted that the figures are not necessarily drawn to scale; and relationships between thicknesses and plane dimensions, ratios in thickness between layers, and the like are not necessarily equal to real values. Accordingly, specific thicknesses and dimensions may be determined by taking the below descriptions into consideration. It should also be noted that some of such dimensions and ratios may differ from drawing to drawing.

In addition, it should be understood that embodiments of the present disclosure are presented to illustrate an apparatus or a method for embodying the technical concept of the present disclosure but are not intended to limit materials, shapes, structures, layouts, etc., of elements. Various modifications falling within the scope of the present disclosure as defined by the appended claims can be applied to the embodiments.

[Schematic Configuration of Integrated Circuit Employing Parallel Interface]

A schematic configuration of an integrated circuit 100 employing a parallel interface 1 according to an embodiment of the present disclosure is described with reference to FIG. 1.

The integrated circuit 100 includes one or more input units (configured with, for example, a plurality of input terminals IO0 to IO23 and a plurality of input lines A0 to A23) that receive, in parallel, predetermined data signals (e.g., signals D0 to D22 as RGB data signals) and a clock signal PCLK; one or more output units (configured with, for example, a plurality of output lines B0 to B23) that output, in parallel, the predetermined data signals in synchronization with the clock signal; and a parallel interface 1 that is installed between the input units and the output units and includes a plurality of transmission lines via which the predetermined data signals and the clock signal are transmitted in parallel.

The transmission lines are configured with a wiring pattern having different electrical lengths and an equal electrical capacitance. An example of such a wiring pattern will be described in detail later.

Schmitt buffers SB0 to SB23, which fall within a type of hysteresis buffers for shaping waveforms of the predetermined data signal and the clock signal, are connected to the input lines A0 to A23 of the input units, respectively. A driving voltage source VDDIO (e.g., 3.3 V) is connected to a positive input terminal of each of the Schmitt buffers SB0 to SB23, and ground potential G is connected to a negative input terminal of each of the Schmitt buffers SB0 to SB23.

Level converting circuits (or level shifters) LS0 to LS23 for converting logic levels of the predetermined data signals and a clock signal are connected to the output lines B0 to B23 of the output units, respectively.

A driving voltage source VCCO (e.g., 1.45 V) is connected to a positive input terminal of each of the level shifters LS0 to LS23, and the ground potential G is connected to a negative input terminal of each of the level shifters LS0 to LS23.

The parallel interface 1 having the above-described wiring pattern is disposed between the Schmitt buffers SB0 to SB23 and the level shifters LS0 to LS23.

A logic circuit 10 for latching the RGB data signals, etc., in synchronization with the clock signal is connected to the output lines B0 to B23. The logic circuit 10 is connected to the driving voltage source VCCO (e.g., 1.45 V).

When the predetermined data signals are RGB data signals, red (R) data signals may be inputted as data signals D0 to D7, green (G) data signals may be inputted as data signals D8 to D15, and blue (B) data signals may be inputted as data signals D16 to D22, although not particularly limited thereto.

Although FIG. 1 illustrates the clock signal PCLK as being inputted from the input terminal TOO, this configuration is merely illustrative and the clock signal PCLK may be inputted from any other terminal (e.g., the input terminal IO11 located in the middle portion of the input terminals IO0 to IO23).

[Configuration Example of Wiring Pattern]

A configuration example of the wiring pattern applied to the parallel interface 1 according to an embodiment of the present disclosure is described with reference to FIG. 2.

Figure 2:
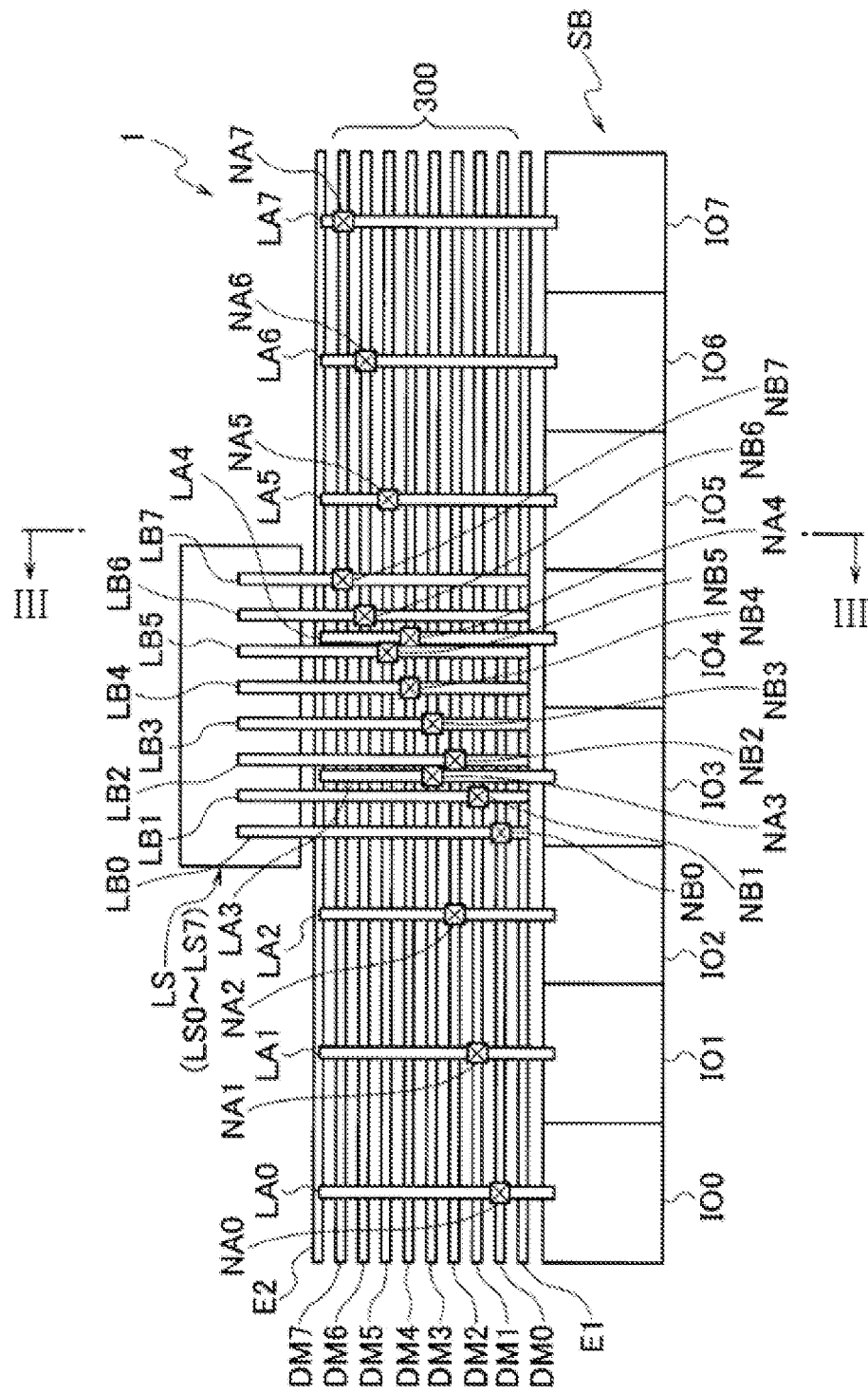
FIG. 2 is a diagram showing a configuration example of a wiring pattern applied to the parallel interface, according to an embodiment of the present disclosure.

FIG. 2 is a plan view schematically showing the configuration example of the wiring pattern.

In this configuration example, for the sake of brevity of explanation, it is assumed that only eight data signals are inputted.

Thus, in this configuration example, an input unit IO has eight input terminals and a level shifter unit LS has eight input terminals.

The input unit IO is configured with Schmitt buffer units SB as illustrated in FIG. 1.

In an actual implementation for inputting the RGB data signals D0 to D23 and the clock signal, the input unit IO may include twenty-five input terminals and the level shifter unit LS may include twenty-five input terminals. In this implementation, generally, the same wiring pattern may be applied.

In addition, the same wiring pattern can be applied to an input unit JO and a level shifter unit LS having different numbers of input terminals.

FIG. 2 shows a layout in which the input unit IO (or input terminals IO0 to IO7) are arranged linearly to face input terminals LS0 to LS7 of the level shifter unit LS via a predetermined spaced portion 300, and the wiring pattern is disposed in the spaced portion 300.

In the spaced portion 300, the wiring pattern includes dummy wirings DM0 to DM7 which extend in a longitudinal direction generally parallel to the input unit JO (or the input terminals IO0 to IO7) and the input terminals LS0 to LS7 of the level shifter unit LS, the dummy wirings DM0 to DM7 being separated from one another, the number of the dummy wirings DM0 to DM7 being equal to the number of the input terminals IO0 to IO7 of the input unit JO (i.e., eight in the example shown in FIG. 2), the lengths and the widths of the dummy wirings DM0 to DM7 being equal to one another; a first earth line (or shield wiring) E1 which is disposed between the dummy wiring DM0 and the input unit JO (or the input terminals IO0 to IO7) and connected to ground potential GDN; a second earth line (or shield wiring) E2 which is disposed between the dummy wiring DM7 and the input terminals LS0 to LS7 of the level shifter LS and connected to the ground potential GDN; first connection lines LA0 to LA7 which extend from the input terminals IO0 to IO7, respectively, to be intersect with the dummy wirings DM0 to DM7 in an insulating state; and second connection lines LB0 to LB7 which extend from the input terminals LS0 to LS7 of the level shifters, respectively, to be intersected with the dummy wirings DM0 to DM7 in an insulating state and which are electrically connected to the first and second earth lines E1 and E2.

The first connection lines LA0 to LA7 are electrically connected to the dummy wirings DM0 to DM7, respectively (at connection nodes NA0 to NA7, respectively). In addition, the second connection lines LB0 to LB7 are electrically connected to the dummy wirings DM0 to DM7, respectively (at connection nodes NB0 to NB7, respectively). The dummy wirings DM0 to DM7 transmit data signals and a clock signal inputted from the input terminals IO0 to IO7 to the input terminals LS0 to LS7, respectively.

Both end terminals of each of the dummy wirings DM0 to DM7 are electrically open.

In this configuration, the transmission lines, which transmit the predetermined data signals and the clock signal in parallel between the input unit IO (or the input terminals IO0 to IO7) and the input terminals LS0 to LS7 of the level shifter unit LS, respectively, can be implemented as a wiring pattern having different electrical lengths and an equal electrical capacitance.

As such, by applying the wiring pattern shown in FIG. 2, it is possible to equalize the areas of the respective data signal transmission lines that include the first connection lines LA0 to LA7, the second connection lines LB0 to LB7, and the dummy lines DM0 to DM7.

The first earth line E1 and the second earth line E2 serve to ensure the wiring capacitances of the dummy wirings DM0 to DM7 located at preceding and succeeding stages of the earth lines E1 and E2, respectively.

Accordingly, the transmission lines have different electrical lengths and an equal electrical capacitance, and thus, it is possible to match the delay times of the data signals and the clock signal in the transmission lines. As a result, the accuracy of AC timing such as setup time and hold time can be improved. In addition, it is possible to equalize the delay amounts of the data signals and the clock signal although wirings are relatively long.

[Three-Dimensional Configuration of Wiring Pattern]

A three-dimensional configuration of an integrated circuit 500 employing the wiring pattern shown in FIG. 2 is described with reference to FIGS. 3 and 4.

Figure 3:
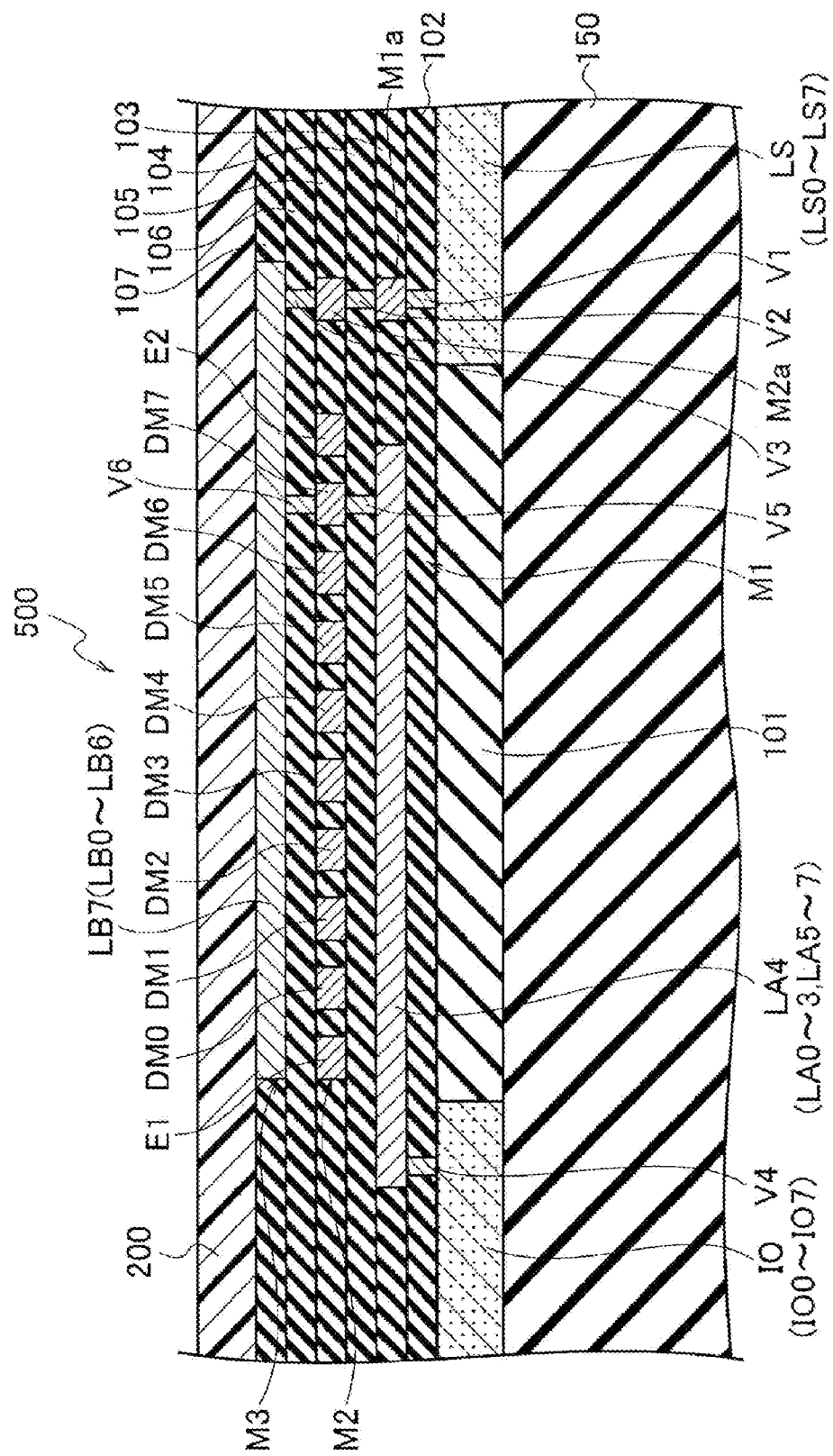
FIG. 3 is a cross-sectional view of the configuration example of the wiring pattern shown in FIG. 2, taken along a line III-III.
Figure 4:
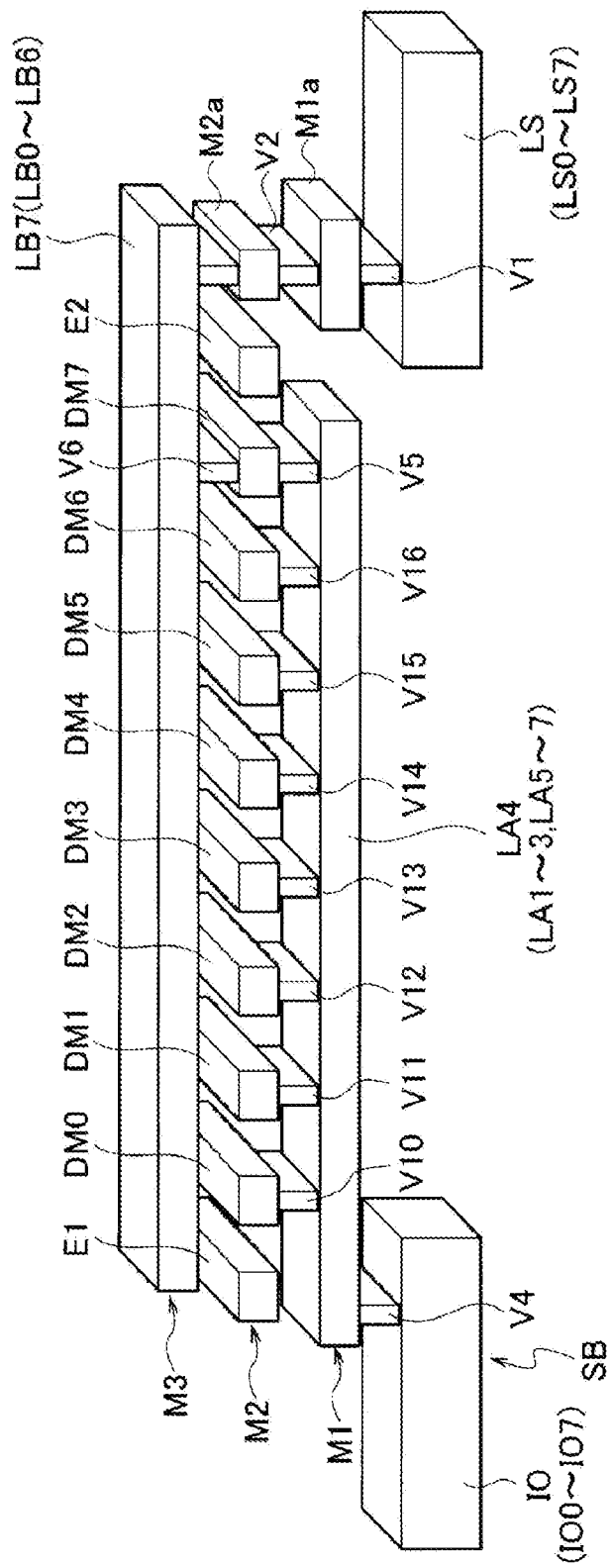
FIG. 4 is a three-dimensional diagram schematically showing the configuration example of the wiring pattern according to the embodiment of the present disclosure.

FIG. 3 is a cross-sectional view of the configuration example of the integrated circuit 500 and the wiring pattern shown in FIG. 2, taken along the line III-III, and FIG. 4 is a three-dimensional view thereof.

As shown in FIG. 3, the input unit IO (or the input terminals IO0 to IO7) and the level shifter unit LS (or the input terminals LS0 to LS7) are formed in the same layer on an insulating substrate 150 such as a direct bonded copper (DBC) substrate. An insulating layer 101 is formed between the input unit IO (or the input terminals IO0 to IO7) and the level shifter unit LS (or the input terminals LS0 to LS7).

The input unit IO is configured with the Schmitt buffer units SB as shown in FIG. 1.

The wiring pattern includes a first metal layer M1 forming the plurality of first connection lines LA4 (and LA0 to LA3 and LA5 to LA7); a second metal layer M2 forming the first earth line E1 and the second earth line E2 connected to the ground potential GDN, and the plurality of dummy wirings DM0 to DM7; and a third metal layer M3 forming the plurality of second connection lines LB0 to LB7.

The input unit IO (or the input terminals IO0 to IO7) is connected to the first metal layer M1 through a via electrode V4 formed at a predetermined location in an insulating layer 102.

The first metal layer M1 is connected to the second metal layer M2, which forms the dummy wirings DM0 to DM7, through a via electrode V5 formed at a predetermined location in an interlayer insulating layer 104.

The second metal layer M2, which forms the dummy wirings DM0 to DM7, is connected to the third metal layer M3 through a via electrode V6 formed at a predetermined location in an interlayer insulating layer 106.

The third metal layer M3 is connected to the input terminals LS0 to LS7 of the level shifter unit LS through via electrodes V3 and V2 (formed at predetermined locations in the interlayer insulating layers 106 and 104), a first metal layer M1a, and a second metal layer M2a.

A resin or ceramic layer 200 for forming a protection layer or a package, or the like is formed on the third metal layer M3.

In addition, the input unit IO (or the input terminals IO0 to IO7), the level shifter unit LS (or the input terminals LS0 to LS7), the first earth line E1, the second earth line E2, the dummy wirings DM0 to DM7, the first connection lines LA4 (and LA0 to LA3 and LA5 to LA7), and the second connection lines LB0 to LB7 are electrically insulated from one another by the interlayer insulating layers 102 to 107.

The first to third metal layers M1 to M3 are made of copper (Cu), aluminum (Al), etc. The interlayer insulating layers 102 to 107 are made of $SiO_2$, etc.

In this configuration, the integrated circuit 500 having the wiring pattern shown in FIG. 2 can be implemented.

[Another Three-Dimensional Configuration of Wiring Pattern]

Figure 5:
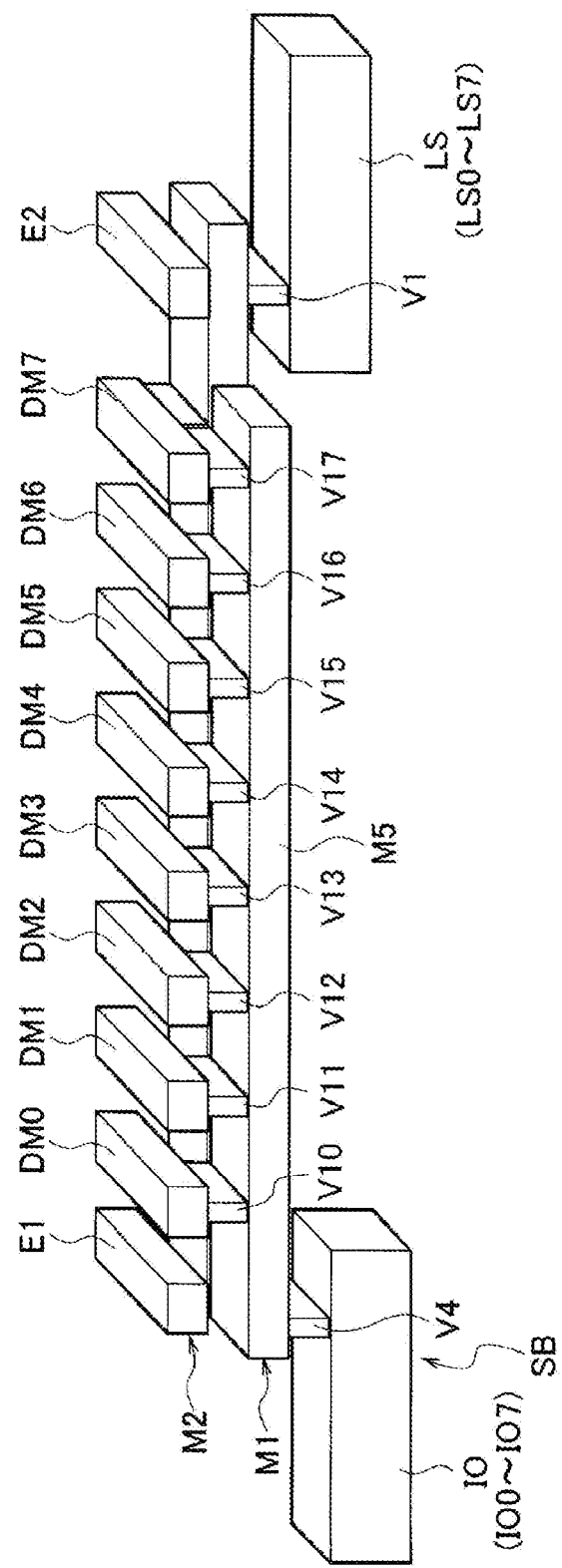
FIG. 5 is a three-dimensional diagram schematically showing another configuration example of a wiring pattern, according to another embodiment of the present disclosure.

FIG. 5 is a three-dimensional diagram schematically showing another configuration example of a wiring pattern according to another embodiment of the present disclosure.

The configuration of the wiring pattern shown in FIG. 5 is different from that of the wiring pattern shown in FIG. 4 in that the former does not include the third metal layer M3 and the functionality of the third metal layer M3 is incorporated into the first metal layer M1.

Specifically, the input unit IO (or the input terminals IO0 to IO7) is connected, through a via electrode V4, to the first metal layer M1 that forms the first connection lines LA0 to LA7 as well as the second connection lines LB0 to LB7.

The input unit IO is configured with the Schmitt buffer units SB shown in FIG. 1.

The second metal layer M2 that forms the first earth line E1, the second earth line E2, and the plurality of dummy wirings DM0 to DM7 is connected to the first metal layer M1 through via electrodes V10 to V17.

In addition, the first metal layer M1 is connected to the level shifter unit LS (or the input terminals LS0 to LS7) through a via electrode V1.

Even with the above two-layer structure, the delay times of the data signals and the clock signal in the transmission lines can be matched to one another, as done, for example, by the wiring pattern shown in FIG. 4. As a result, it is possible to improve the accuracy of AC timing such as set up time and hold time. In addition, it is possible to equalize the delay amounts of the data signals and the clock signal even in the case of relatively long wirings.

[Wiring Pattern According to Comparative Example]

A parallel interface 700 having a wiring pattern according to a comparative example is described with reference to FIG. 6.

In the wiring pattern according to the comparative example, in order to match the delays of data signals and a clock signal in paths from an input unit IO (e.g., input terminals IO0 to IO27) to a level shifter unit LS to improve synchronization accuracy with the data signals or the like, the lengths from the input unit IO (e.g., the input terminals IO0 to IO27) to the level shifter unit LS are all equal.

Figure 6:
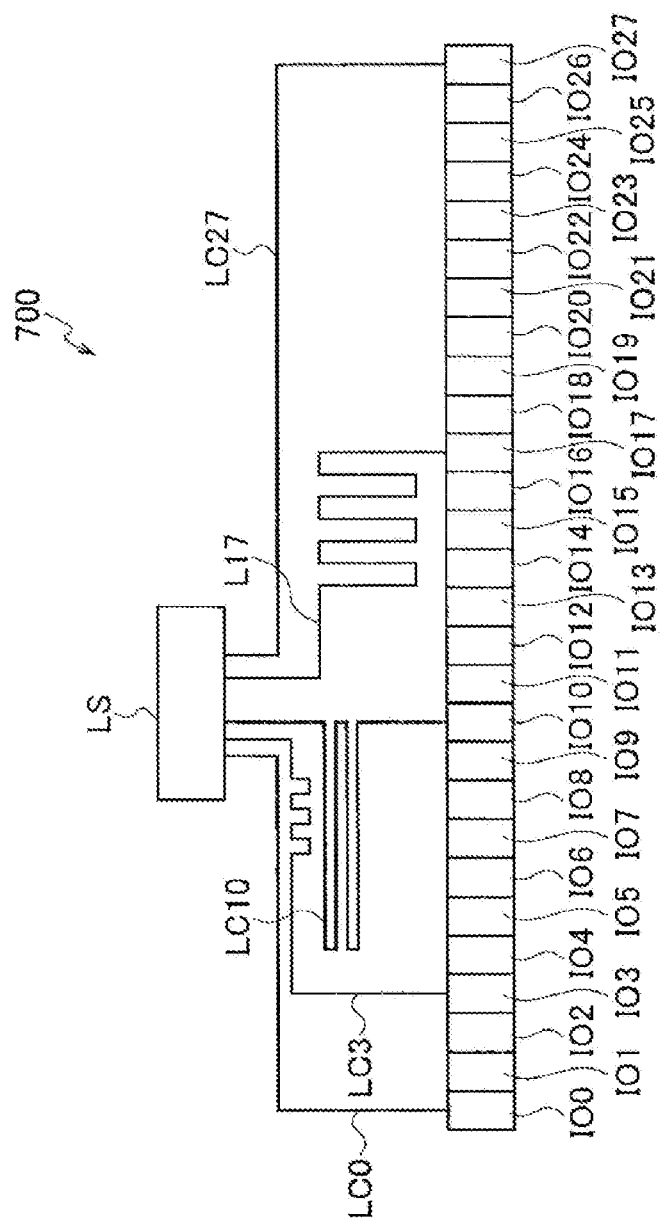
FIG. 6 is a diagram schematically showing a configuration of an integrated circuit employing a parallel interface according to a comparative example.

In other words, as can be seen from FIG. 6, the lengths of the wirings from the input unit IO (e.g., the input terminals IO0 to IO27) to the level shifter unit LS, for example, the lengths of wirings LC3, LC10, LC17, and LC27 are all equal. Specifically, the lengths of the wirings may be adjusted by bending them. Although FIG. 6 shows only the wirings LC3, LC10, LC17, and LC27 for brevity of explanation, each of the input terminals IO0 to IO27 of the input unit IO is connected to the level shifter unit LS in a similar manner, in actual implementation.

It should be noted that since a clock signal is inputted to the input terminal IO0 in the example shown in FIG. 6, the length of the wiring LC0 may be different from the lengths of other wirings.

However, in the wiring pattern according to the comparative example, when a difference in wiring capacitance is made in relatively long wirings, for example, it is difficult to match the delay times of data signals and a clock signal in transmission lines. In addition, accuracy of AC timing such as set up time and hold time is also lowered.

In contrast, in the parallel interface 1 having the wiring pattern according to an embodiment of the present disclosure and the integrated circuit 500 employing the same, the wiring capacitances of the transmission lines are all equal, so that the delay amounts of data signal and a clock signal become equal to one another even in the case of relatively long wirings. As a result, it is possible to improve accuracy of AC timing (e.g., set up time and hold time).

[Comparison Test]

Hereinafter, the results of a comparison test are described with reference to FIGS. 7 to 11, in which the parallel interface 1 having the wiring pattern according to an embodiment of the present disclosure and the parallel interface having the wiring pattern according to the comparative example are compared with each other.

This comparison test was conducted using a parallel interface having an input unit IO including input terminals IO0 to IO23 to which data signals D0 to D23 may be inputted, and a level shifter unit LS including input terminals LS0 to LS 23.

Figure 7:
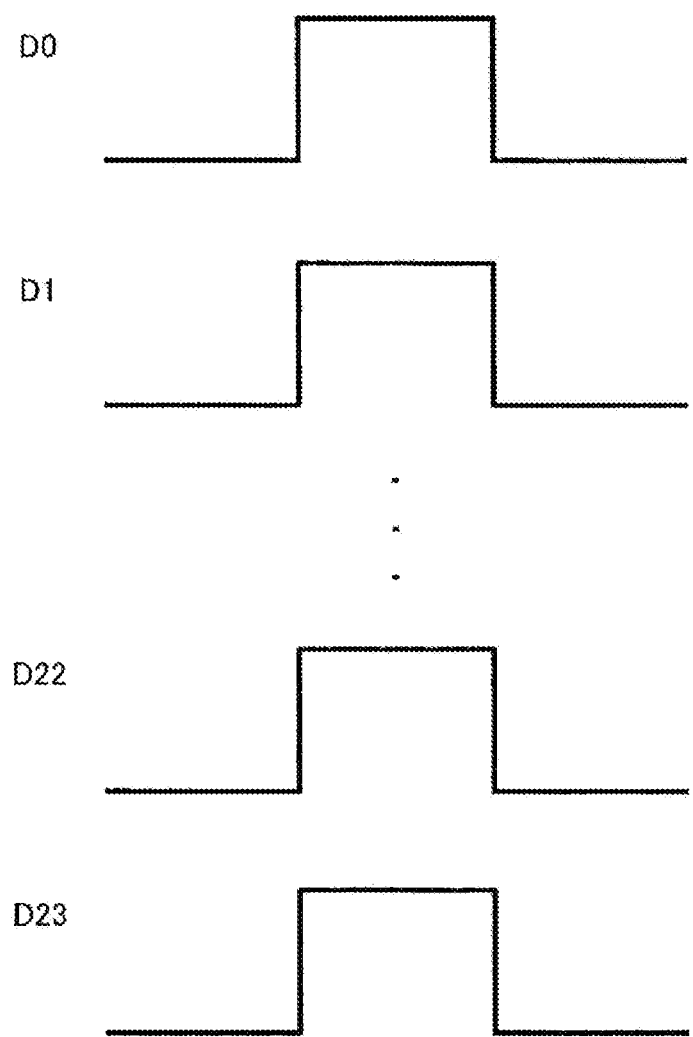
FIG. 7 is a diagram showing an example of waveforms inputted to an integrated circuit employing a parallel interface according to an embodiment of the present disclosure.
Figure 8:
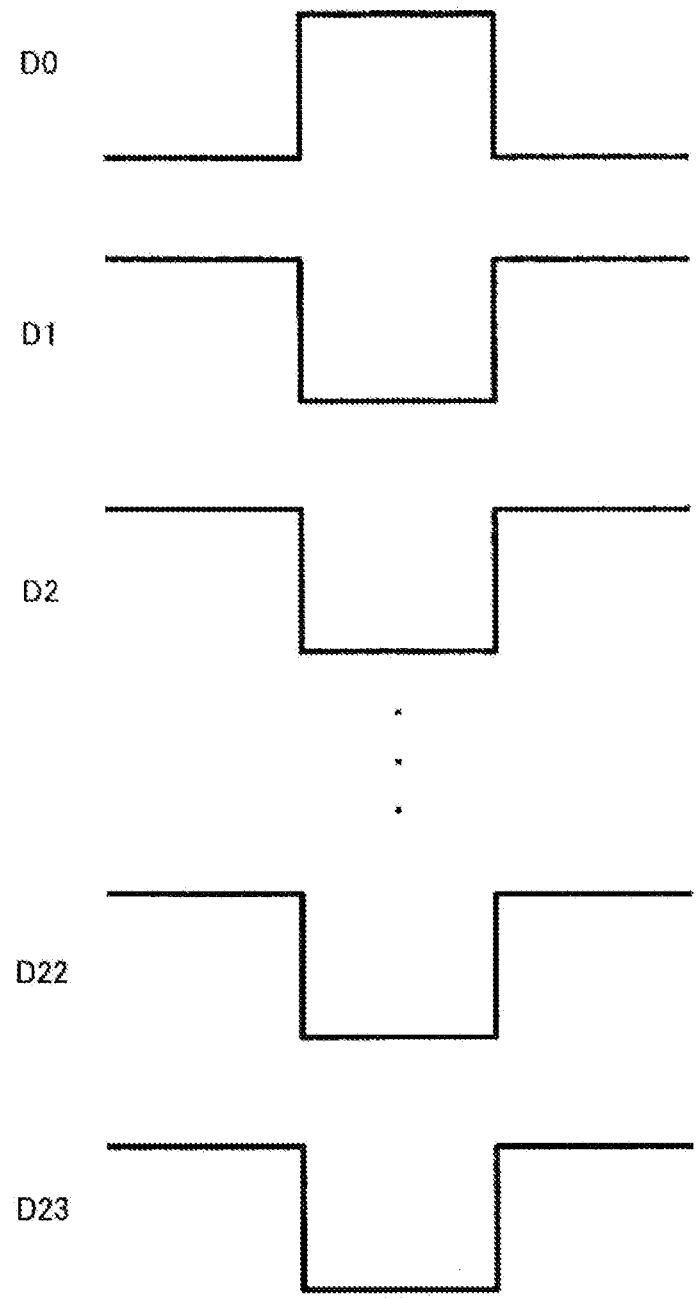
FIG. 8 is a diagram showing another example of waveforms inputted to the integrated circuit employing the parallel interface according to the embodiment of the present disclosure.
Figure 9:
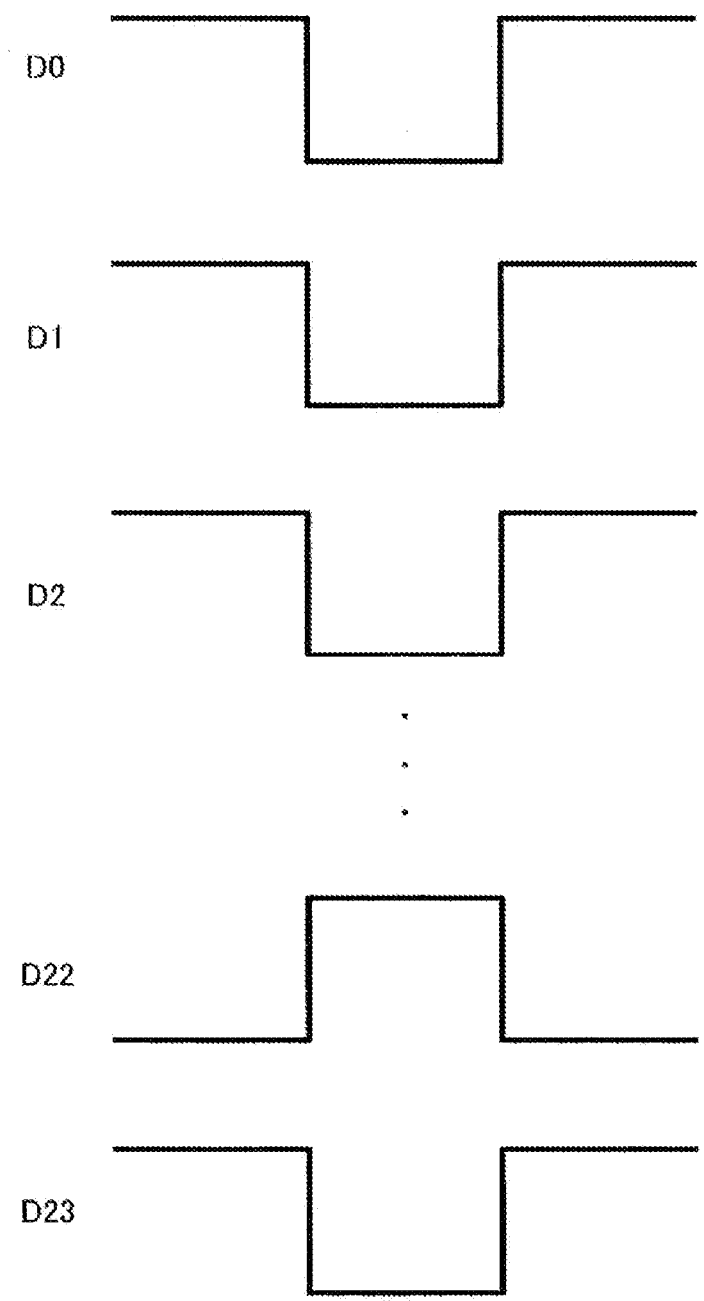
FIG. 9 is a diagram showing still another example of waveforms inputted to the integrated circuit employing the parallel interface according to the embodiment of the present disclosure.

As test input data values for conducting the comparison test, an input pattern A having the waveforms shown in FIG. 7 and input patterns B having the waveforms shown in FIGS. 8 and 9 are prepared for the test.

More specifically, the input pattern A shown in FIG. 7 has the waveforms in which all the data bits of the data signals D0 to D23 are in phase.

In addition, the input pattern B shown in FIG. 8 has the waveforms in which only the data bit of the data signal D0 is in anti-phase with the data bits of the data signals D1 to D23. The input pattern B shown in FIG. 9 has the waveforms in which only the data bit of the data signal D22 is in anti-phase with the data bits of the data signals D0 to D21 and D23.

The input patterns B are prepared to involve waveforms in which only one data signal of a specific input terminal is in anti-phase with the other data signals of the other input terminals from the input terminals IO0 to IO23.

Figure 10:
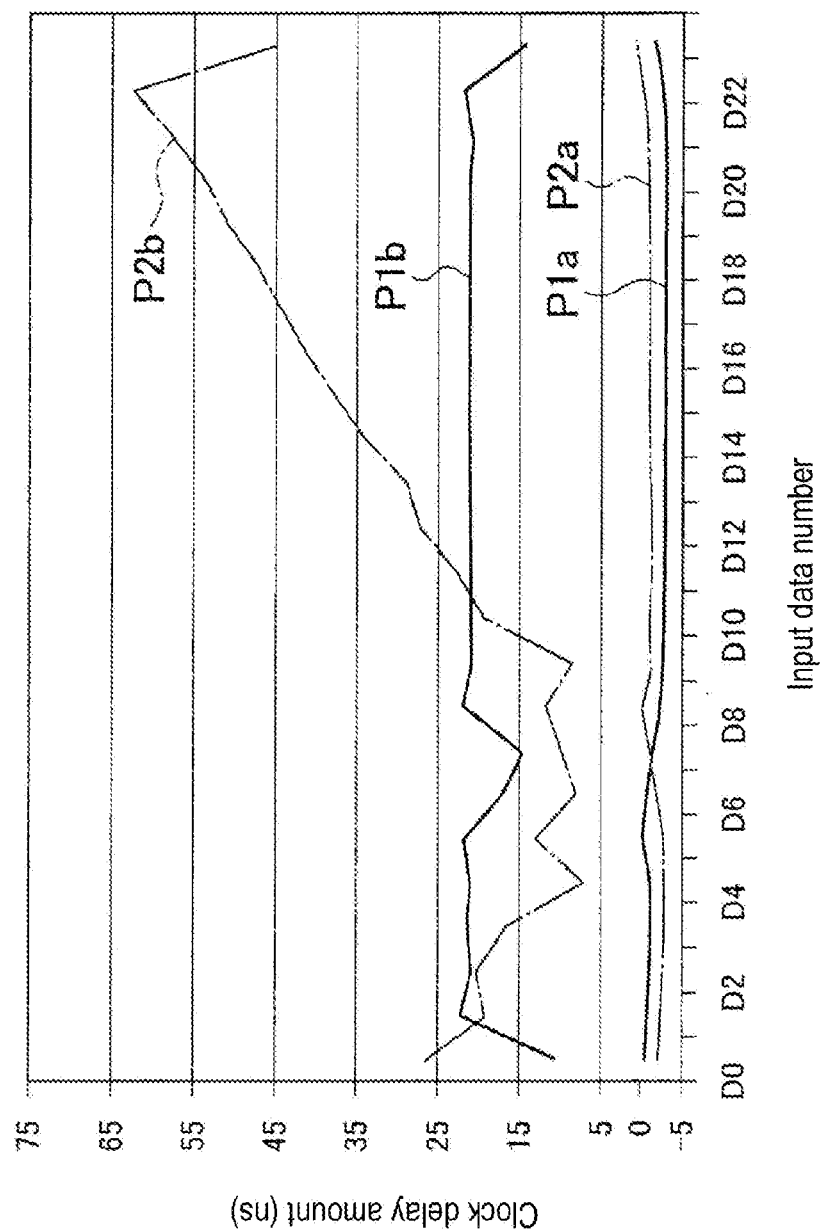
FIG. 10 is a graph showing the relationship between a clock delay amount and input data values when predetermined waveforms are inputted to input units of the integrated circuit employing the parallel interface according to the embodiment of the present disclosure and an integrated circuit employing the parallel interface according to the comparative example.

FIG. 10 is a graph showing the relationship between clock delay amount and input data when the test input data values having the input patterns A and B are inputted to the input unit of the integrated circuit employing the parallel interface 1 according to an embodiment of the present disclosure and to the input unit of the integrated circuit employing the parallel interface 700 according to the comparative example.

FIG. 10 shows differences in delay values between the input data signals D0 to D23 and the clock signal PCLK.

The vertical axis represents the clock delay amount. The clock delay amount is ideally zero, has a positive value when the clock signal leads the data signals, and has a negative value when the clock signal lags behind the data signals. The delay amount (or delay time) is expressed in ns.

As such, a positive value of the clock delay time indicates that the delay value of a data signal is larger than the delay value of the clock signal PCLK. A negative value of the clock delay time, on the other hand, indicates that the delay value of a data signal is smaller than the delay value of the clock signal PCLK. That is, the vertical axis shows set up time in terms of AC timing.

The horizontal axis represents input terminal numbers. For brevity or explanation, the graph shown in FIG. 10 only shows input terminal numbers associated with even-numbered input data values, i.e., D0, D2, . . . , D20, and D22.

A plot line P2a shows the result of the test when the test input data values having the input pattern A shown in FIG. 7 are inputted to the input terminals IO0, IO2, . . . , IO20, and IO22 of the integrated circuit employing the parallel interface 700 according to the comparative example.

A plot line P2b shows the result of the test when the test input data values having the input patterns B shown in FIGS. 8 and 9 are inputted to the input terminals IO0, IO2, . . . , IO20, and IO22 of the integrated circuit employing the parallel interface 700 according to the comparative example.

As can be seen from the plot line P2a, for the input pattern A having the waveforms in which all data bits are in phase, the clock delay amount falls within the range from approximately −5 ns to 0 ns throughout the entire range of data signals D0, D2, . . . , D20, and D22. Accordingly, it can be said that the clock delay amount is relatively stable.

On the other hand, as can be seen from the plot line P2b, when the input patterns B having the waveforms in which only a corresponding data signal is in anti-phase, the clock delay amount greatly fluctuates in the range from approximately 5 ns to 65 ns.

Accordingly, deviations between the plot lines P2a and P2b is large. Therefore, it can be said that skews (or deviations in timing) between data signals are relatively large in the integrated circuit employing the parallel interface 700 according to the comparative example.

On the other hand, a plot line P1a shows the result of the test when the test input data values having the input pattern A shown in FIG. 7 are inputted to the input terminals IO0, IO2, . . . , IO20, and IO22 of the integrated circuit employing the parallel interface 1 according to the embodiment of the present disclosure.

In addition, a plot line P1b shows the result of the test when the test input data values having the input patterns B shown in FIGS. 8 and 9 are inputted to the input terminals IO0, IO2, . . . , IO20, and IO22 of the integrated circuit employing the parallel interface 1 according to the embodiment of the present disclosure.

As can be seen from the plot line P1a, for the input pattern A having the waveforms in which all data bits are in phase, the clock delay amount falls within the range from approximately −5 ns to 0 ns throughout the entire range of data signals D0, D2, . . . , D20, and D22. Accordingly, it can be said that the clock delay amount is relatively stable.

Moreover, as can be seen from the plot line P1b, when the input patterns B having the waveforms in which a data signal is in anti-phase are inputted, the clock delay amount falls within the range from approximately 10 ns to 20 ns. Accordingly, it can also be said that the clock delay amount is relatively stable.

Accordingly, deviations between the plot lines P1a and P1b are significantly stable. Therefore, it can be seen that skews between data signals are greatly reduced in the integrated circuit employing the parallel interface 1 according to the embodiment of the present disclosure.

It can be seen from FIG. 10 that skews (or deviations) between the data signals D0 to D23 can be improved according to the embodiment of the present disclosure.

Figure 11:
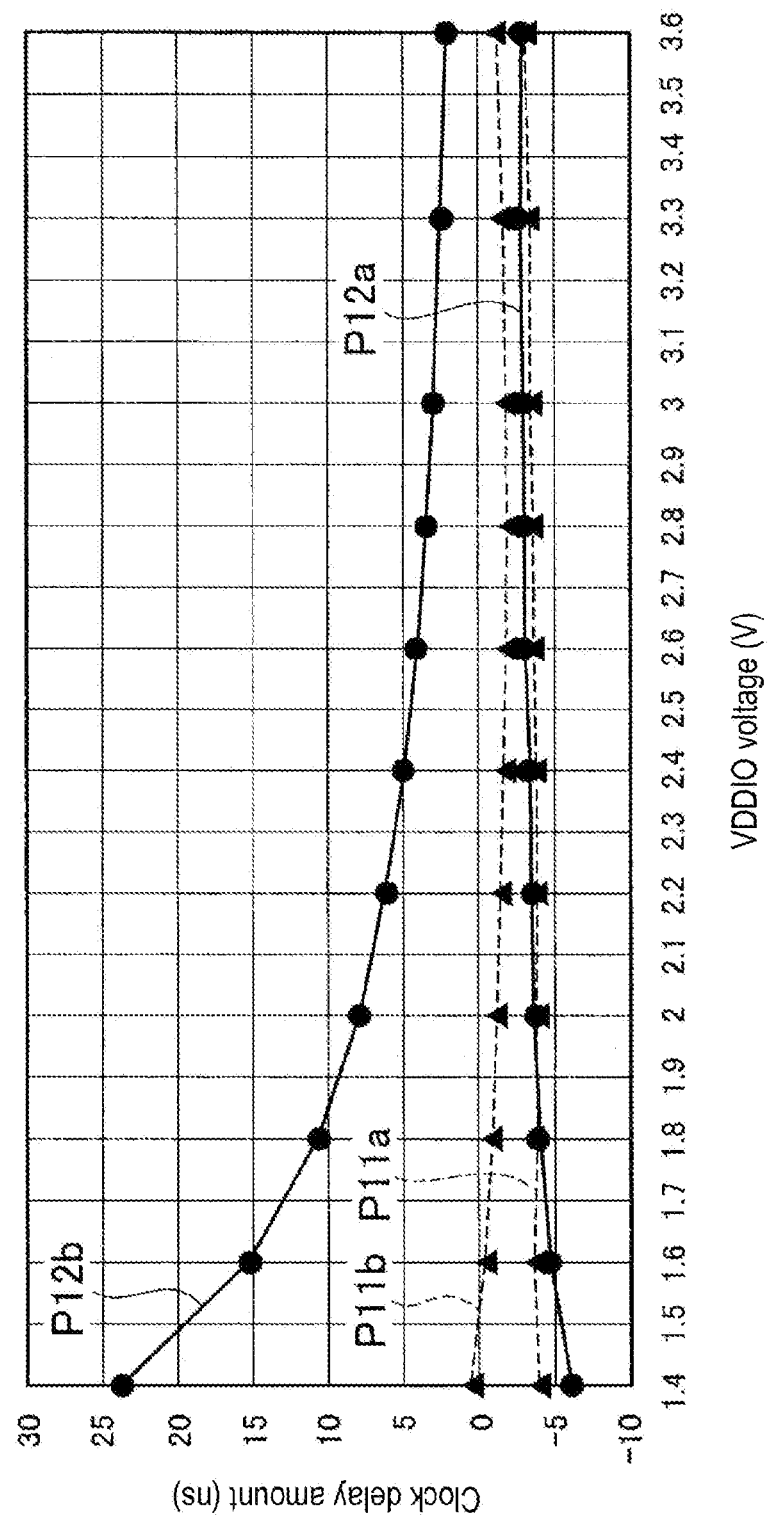
FIG. 11 is a graph showing supply voltage characteristics when predetermined waveforms are inputted to the input units of the integrated circuit employing the parallel interface according to the embodiment of the present disclosure and the integrated circuit employing the parallel interface according to the comparative example.

FIG. 11 is a graph showing supply voltage characteristics, i.e., set up time, when a signal having a predetermined waveform is inputted to the input unit of the integrated circuit employing the parallel interface 1 according to an embodiment of the present disclosure and the input unit of the integrated circuit employing the parallel interface 700 according to the comparative example.

The vertical axis of FIG. 11 represents clock delay amount. The clock delay amount is ideally zero, has a positive value when the clock signal leads the data signals, and has a negative value when the clock signal is lags behind the data signals. The delay amount (or delay time) is expressed in ns.

The horizontal axis of FIG. 11 represents driving voltage source VDDIO applied to the Schmitt buffers SB0 to SB23 shown in FIG. 1, varying in the range from 1.4 V to 3.6 V.

A plot line P12a shows the result of the test when the test input data values having the input pattern A shown in FIG. 7 are inputted to the input terminals IO0 to IO23 of the integrated circuit employing the parallel interface 700 according to the comparative example, while varying the driving voltage source VDDIO applied to the Schmitt buffers SB0 to SB23 in the range from 1.4 V to 3.6 V.

A plot line P12b shows the result of the test when the test input data values having the input patterns B shown in FIGS. 8 and 9 are inputted to the input terminals IO0 to IO23 of the integrated circuit employing the parallel interface 700 according to the comparative example, while varying the driving voltage source VDDIO applied to the Schmitt buffers SB0 to SB23 in the range from 1.4 V to 3.6 V.

As can be seen from the plot line P12a, for the input pattern A having the waveforms in which all data bits are in phase, the clock delay amount falls within the range from approximately −3 ns to −5 ns throughout the entire range of the driving voltage source VDDIO from 1.4 V to 3.6 V. Accordingly, it can be said that the clock delay amount is relatively stable.

On the other hand, as can be seen from the plot line P12b, for the input patterns B having the waveforms in which only a corresponding data signal is in anti-phase, the clock delay amount greatly fluctuates in the range from approximately 3 ns to 25 ns, with the driving voltage source VDDIO from 1.4 V to 3.6 V.

In particular, when the driving voltage source VDDIO is a low voltage (approximately 1.4 V to 2 V), the clock delay amount has a large value such as 5 ns to 25 ns.

Accordingly, deviations between the plot lines P12a and P12b are large. Therefore, it can be said that supply voltage characteristics relatively deteriorate in the integrated circuit employing the parallel interface 700 according to the comparative example.

On the other hand, a plot line P11a shows the result of the test when the test input data values having the input pattern A shown in FIG. 7 are inputted to the input terminals IO0 to IO23 of the integrated circuit employing the parallel interface 1 according to an embodiment of the present disclosure, while varying the driving voltage source VDDIO applied to the Schmitt buffers SB0 to SB23 in the range from 1.4 V to 3.6 V.

A plot line P11b shows the result of the test when the test input data values having the input patterns B shown in FIGS. 8 and 9 are inputted to the input terminals IO0 to IO23 of the integrated circuit employing the parallel interface 1 according to the embodiment of the present disclosure, while varying the driving voltage source VDDIO applied to the Schmitt buffers SB0 to SB23 in the range from 1.4 V to 3.6 V.

As can be seen from the plot line P11a, for the input pattern A having the waveforms in which all data bits are in phase, the clock delay amount falls within the range from approximately −3 ns to −6 ns throughout the entire range of the driving voltage source VDDIO from 1.4 V to 3.6 V. Accordingly, it can be said that the clock delay amount is relatively stable.

Moreover, as can be seen from the plot line P11b, for the input patterns B having the waveforms in which a data signal is in anti-phase, the clock delay amount falls within the range from approximately −2 ns to 0 ns, with the driving voltage source VDDIO from 1.4 V to 3.6 V. Accordingly, it can be said that the clock delay amount is very stable.

Accordingly, deviations between the plot lines P11a and P11b are also significantly stable. Therefore, it can be seen that skews between data signals are greatly reduced in the integrated circuit employing the parallel interface 11 according to the embodiment of the present disclosure.

In other words, according to the embodiment of the present disclosure, the clock delay amount can be improved throughout the entire range of the driving voltage source VDDIO.

As described above, in the integrated circuit employing the parallel interface 1 according to the embodiment of the present disclosure, it is possible to equalize the delay amounts of data signal and a clock signal even in the case of relatively long wirings.

[Other Embodiments]

While descriptions have been made in view of the embodiment, the descriptions and the drawings constituting a part of the specification are regarded in an illustrative rather than in a restrictive sense. After learning the teachings contained in this disclosure, a variety of modifications and generalizations will be apparent to a person skilled in the art without departing from the scope of the present disclosure.

As such, embodiments of the present disclosure include a variety of embodiments other than disclosed herein.

The parallel interface according to an embodiment of the present disclosure and the integrated circuit including the same may be employed by a variety of high-speed interface, an image processing apparatus, etc.

According to the present disclosure, a parallel interface and an integrated circuit using the same can be provided, in which delay amounts of data signals and a clock signal are equal even in the case of relatively long wirings.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A parallel interface comprising:
   an input unit configured to input, in parallel, a plurality of predetermined data signals and a clock signal;
   an output unit configured to output, in parallel, the predetermined data signals in synchronization with the clock signal; and
   a plurality of transmission lines disposed between the input unit and the output unit and configured to transmit, in parallel, the predetermined data signals and the clock signal,
   wherein the transmission lines are configured with a wiring pattern in which the transmission lines have different electrical lengths and an equal electrical capacitance,
   wherein a hysteresis buffer for shaping waveforms of the predetermined data signals and the clock signal is disposed at a side of the input unit, and a level converting circuit for converting logic levels of the predetermined data signals is disposed at a side of the output unit, and wherein the wiring pattern is disposed between the hysteresis buffer and the level converting circuit.

2. The parallel interface of claim 1, wherein the hysteresis buffer includes a Schmitt buffer.

3. The parallel interface of claim 1, wherein the level converting circuit includes a level shifter having input terminals arranged linearly, a number of the input terminals being equal to a number of the predetermined data signals and the clock signal, wherein the input unit is linearly arranged to face the input terminals of the level shifter with a predetermined spaced portion disposed between the input unit and the input terminals of the level shifter, and wherein the wiring pattern is disposed in the spaced portion.

4. The parallel interface of claim 3, wherein the wiring pattern in the spaced portion, comprises:

dummy wirings which extend in a longitudinal direction generally parallel to the input unit and the input terminals of the level shifter, the dummy wirings being insulated from one another, a number of the dummy wirings being equal to a number of input terminals of the input unit, and lengths and widths of the dummy wirings being equal to one another;

a first earth line which is disposed between the dummy wirings and the input unit and connected to a ground potential;

a second earth line which is disposed between the dummy wirings and the input terminals of the level shifter and connected to the ground potential;

first connection lines which extend from the input unit to intersect with the dummy wirings in an insulation state; and second connection lines which extend from the input terminals of the level shifter to intersect with the dummy wirings in an insulation state, wherein the first connection lines are electrically connected to the dummy wirings, respectively, and the second connection lines are electrically connected to the dummy wirings, respectively, the dummy wirings transmitting the data signals and the clock signal inputted from the input unit to the input terminals of the level shifter, respectively.

5. The parallel interface of claim 4, wherein both end terminals of each of the dummy wirings are electrically open.

6. An integrated circuit comprising the parallel interface of claim 4.

7. The integrated circuit of claim 6, wherein the input unit and the level shifter are formed in the same layer on an insulating substrate, and wherein the wiring pattern comprises:
a first metal layer which forms the first connection lines;
a second metal layer which forms the first earth line, the second earth line, and the dummy wirings; and
a third metal layer which forms the second connection lines, wherein the input unit is connected to the first metal layer through a first via electrode at a first predetermined location, wherein the first metal layer is connected to the second metal layer, which forms the dummy wirings, through a second via electrode at a second predetermined location, wherein the second metal layer, which forms the dummy wirings, is connected to the third metal layer through a third via electrode at a third predetermined location, and wherein the third metal layer is connected to the input terminals of the level shifter through the first metal layer, the second metal layer, and a fourth via electrode at a fourth predetermined location.

8. The integrated circuit of claim 7, wherein the input unit, the level shifter, the first earth line, the second earth line, the dummy wirings, the first connection lines, and the second connection lines are electrically insulated from one another by one or more insulating layers.

9. The integrated circuit of claim 7, wherein the second metal layer, which forms the first earth line and the second earth line, is connected to the ground potential at a fifth predetermined location.

10. The integrated circuit of claim 7, wherein both end terminals of the second metal layer, which forms the dummy wirings, are electrically open.

11. A parallel interface comprising:
an input unit configured to input, in parallel, a plurality of predetermined data signals and a clock signal;
an output unit configured to output, in parallel, the predetermined data signals in synchronization with the clock signal; and
a plurality of transmission lines disposed between the input unit and the output unit and configured to transmit, in parallel, the predetermined data signals and the clock signal, wherein the transmission lines are configured with a wiring pattern in which the transmission lines have different electrical lengths and an equal electrical capacitance, wherein the predetermined data signals include RGB data signals, and wherein a logic circuit configured to latch the RGB data signals in synchronization with the clock signal is connected to the output unit.

* * * * *